United States Patent [19]

Spaight

[11] 4,092,697

[45] May 30, 1978

[54] HEAT TRANSFER MECHANISM FOR INTEGRATED CIRCUIT PACKAGE

[75] Inventor: Ronald Neil Spaight, Vestal, N.Y.

[73] Assignee: International Business Machines Corporation, Armonk, N.Y.

[21] Appl. No.: 748,077

[22] Filed: Dec. 6, 1976

[51] Int. Cl.² ............................................... H05K 7/20
[52] U.S. Cl. .................................. 361/386; 361/387; 174/16 HS; 357/81
[58] Field of Search ................ 361/385, 389, 386–388; 357/81, 82; 174/16 HS, 52 FP

[56] References Cited

U.S. PATENT DOCUMENTS 3,616,533  11/1971  Heap ................................ 174/52 FP
3,673,306  6/1972   Kirpatrick .......................... 357/82

OTHER PUBLICATIONS

IBM Tech. Disc. Bull., Chip Cooling, Ing, vol. 13, No. 5, Oct. 1970, p. 1060.
IBM Tech. Disc. Bull., External Module Heat Sink Fastened to Board, Cunavelis, vol. 14, No. 1, Jun. 1964, p. 182.

Primary Examiner—Gerald P. Tolin
Attorney, Agent, or Firm—Cyril A. Krenzer

[57] ABSTRACT

Heat is removed from silicon devices in an integrated circuit package by means of a thermal liquid material contained in a film mounted on the underside of a cover enclosing the integrated circuit device. The film is electrically non-conductive and the film with the enclosed thermal liquid material form a formable pillow such that after the chip/substrate are assembled, the cover with the film containing the thermal liquid material is placed over the substrate and sealed thereto in a manner such that the film comes into direct contact with the top of the chips mounted on the substrate. This provides a direct heat transfer from the chip through the film to the thermal liquid material out to the cover, which may be formed as a heat radiator.

7 Claims, 4 Drawing Figures

HEAT TRANSFER MECHANISM FOR INTEGRATED CIRCUIT PACKAGE

BACKGROUND OF THE INVENTION

1. Field of the Invention

This invention relates generally to heat transfer mechanisms, and more particularly to a heat transfer mechanism for removing the heat generated in an integrated circuit package assembly.

2. Prior Art

The efficient extraction of heat from integrated circuit chip packages has presented a very significant limitation on the design capability of integrated circuits. Without an efficient heat transfer mechanism, the speed and power capabilities of the circuitry of an integrated circuit package are severely limited. Early semiconductor devices solved the problem by making one of the electrodes of the device both a thermal and electrical direct contact to the external world and thereby connecting the electrode to an efficient heat transfer device, such as a studded heat sink. This was especially convenient when the electrode could be maintained at ground potential, for example. Typical discrete semiconductor devices of these configurations are found in U.S. Pat. Nos. 3,719,862 and 3,836,825. This approach was also used in some of the early approaches to the removal of heat from integrated circuit packages. For example, in an article entitled "Conduction Cooled Heat Plate for Modular Circuit Package" in Volume 13, No. 2, of the July 1970 issue of the IMB Technical Disclosure Bulletin there is disclosed a cooling technique using a conduction cooled, isothermal heat plate which is metallurgically connected via an appropriate slug to the various circuit chips in an integrated circuit package. With this technique the chip is fixed at the potential of the heat plate.

An additional difficulty encountered when the stud is connected directly to the chip, is that various "Z" stresses occur during the routine heat cycling the device experiences. These repeated stresses can cause fatigue to the various connections within the devices, which often lead to a failure of a device.

However, there are many instances when the integrated circuit chip cannot be maintained at ground potential or at the potential of a heat sink. This presents a significant problem, since most good heat transfer mechanisms are also good electrical conductors. Many integrated circuit package designs include the integrated circuit with discrete bond points to a suitable substrate, enclosed by a cover in a sealed atmosphere of an inert gas. In these packages, the only thermal paths are the convection through the inert gas to the cover and conduction through the discrete bond points to the substrate. Such a design often experiences very significant thermal resistance, which severely limits the power dissipation of the package. These restrictions are much more serious for devices that are flip-chip joined to the substrate through a series of bumps or solder balls on the active side of the chips. Here the conduction areas provided by the bumps are quite small and usually inadequate for heat dissipation of the higher power devices. While it is possible to enhance the heat transfer from a flip chip, such as by a metallurgical joining of the backside of the chip to the cover, this may result in additional stresses on the device and a serious reliability problem. Furthermore, as device costs increase, it is desirable to be able to repair defective devices. This is difficult to do when there is a metallurgical joining of the backside of the chip to the cover.

The above described problems can be even more acute when dealing with multi-chip modules, where many chips are bonded to a single substrate. A common requirement of such modules is that different chips are biased at different electrical potentials, so they cannot be commoned to a single point. Since such modules usually have a much larger substrate than single chip modules, the reliability problem resulting from different thermal expansion characteristics are even more pronounced. As the distance of a chip from the neutral point of the substrate increases, the thermal stresses experienced resulting from the metallurgical bonding of the chip to the cover increase.

A further consideration in dealing with multichip modules is that they are usually much more expensive than single chip modules. Accordingly, it becomes even more desirable to be able to remove the cover of the module and repair or replace any defective component. As mentioned above, the metallurgical joining of the cover to the backsides of the chips makes such repair and rework difficult, if not impossible.

OBJECTS AND SUMMARY OF THE INVENTION

Accordingly, it is a principal object of the present invention to provide a heat transfer mechanism for an integrated circuit package which overcomes the foregoing disadvantages of the prior art.

A more specific object of the present invention is to provide a heat transfer mechanism for an integrated circuit package which presents a low thermal resistance, while still maintaining a high electrical resistance to the integrated circuit device.

Still another specific object of the present invention is to provide a heat transfer mechanism for an integrated circuit package which overcomes the heat transfer gate provided by the bumps in a flip-chip device.

An additional object of the present invention is to provide a heat transfer mechanism for an integrated circuit package which does not adversely affect the reworkability of the package.

Still another object of the present invention is to provide a heat transfer mechanism for an integrated circuit package which is both economical and reliable.

A still further object of the present invention is to provide a heat transfer mechanism for an integrated circuit package which minimizes the stresses placed on the integrated circuit device.

The foregoing and other objects and advantages are accomplished according to one aspect of the invention wherein a thermal liquid material is contained in a film mounted on the underside of a cover adapted to enclose an integrated circuit package. The film is electrically non-conductive and together with the thermal liquid material provides a formable pillow such that after a chip is assembled on a substrate, the cover with the film containing the thermal liquid material is placed over the substrate and sealed thereto. The formable pillow comes into direct contact with the top of the chip or chips mounted on the substrate and thereby provides a direct heat transfer from the chip through the film to the thermal liquid material and out to the cover and an associated heat sink.

DESCRIPTION OF THE PREFERRED EMBODIMENTS

Figure 1:
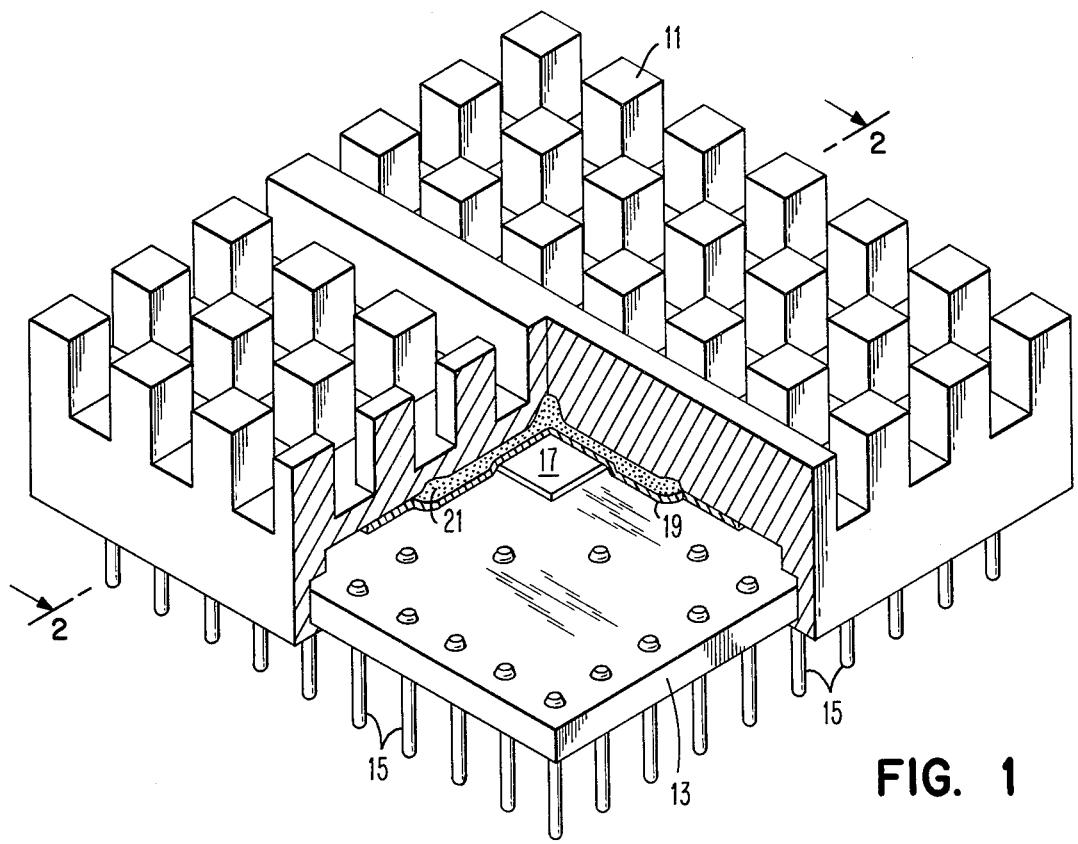
FIG. 1 is a top, frontal perspective view partially in section of an integrated circuit package with a heat transfer mechanism according to the present invention.

Referring first to FIG. 1, there is shown an integrated circuit package including a cover 11, formed as a heat radiator or heat sink, mounted on a substrate 13 having a plurality of through pins 15 to provide connections via circuit lines (not shown) from the integrated circuit device 17 mounted on the substrate 15. Mounted on the underside of the cover 11 is a film 19 containing a thermally conductive material 21 with the film 19 being brought into contact with the top surface of the device 17 as the cover 11 is brought into place and sealed to the substrate 13. The seal can be accomplished by any one of a number of conventional sealing techniques.

Figure 2:
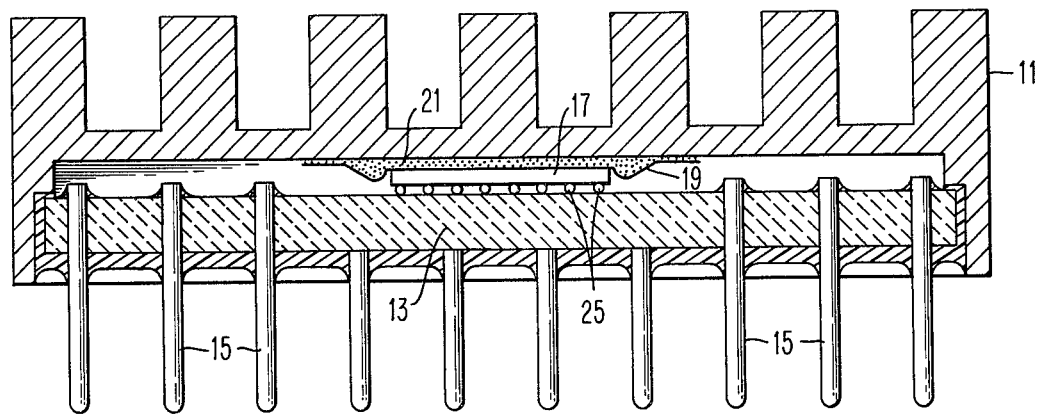
FIG. 2 is a sectional view of the integrated circuit package taken along lines 2—2 of FIG. 1; and, FIGS. 3 and 4 are partial, sectional views of alternate embodiments of the heat transfer mechanism according to the present invention.

Referring next to the cross-sectional view of FIG. 2, it can be seen that the integrated circuit device 17 is connected to the top of the substrate 13 by a plurality of connections 25, which may be, for example, solder balls. Since these are the only connections between the device 17 and the substrate 13, there is a very limited thermal path therebetween and as a result it would otherwise be difficult to dissipate the heat from the device 17. However, with the formable film 19 encapsulating the thermally conductive material 21, intimate contact is made between the film 19 and the top of the device 17, thereby providing a direct heat transfer path between the device 17 to the cover 11 formed as a heat sink or heat radiator.

The material for the formable film is preferably a dielectric material, which can be a suitable organic polymer such as polyimide or polyester, or could be a thin metallic foil oxidized on the side contacting the chip. As an alternative, the dielectric could be formed on the backside of the chip or chips, which would eliminate the need to have a dielectric film, although such a film could still be used.

The film 19 may be secured to the cover 11 by any conventional technique that provides a relatively strong, air tight seal. For example, the periphery of the film could be laminated to the cover or could be secured by some epoxy or other suitable adhesive, which will not contaminate the environment of the device 17. It is preferable that the cavity containing the thermally conductive material 21 be evacuated prior to sealing the film to the cover to remove any air therefrom which might otherwise act as a thermal barrier in the pillow.

The thermally conductive material 21 can be determined by the thermal resistance needs, the expansion properties of the material, and the deformation characteristics. The material could, for example, be thermal grease, powdered metal or low melt metal or alloy that remains liquid at room temperatures. Low melt metals could include solder, mercury, cesium or gallium. Generally the composite composed of the membrane or film 19 and the thermally conductive material 21 will provide a controlled pressure on the device 17 at all times thereby insuring an adequate thermal path between the device 17 and the module cover 11.

The foregoing formable pillow concept has a number of specific advantages. It provides a very significant thermal gain to the module, there is a sealed thermal path preventing contamination of the module environment and it is adaptable to present module sealing techniques including metallized ceramic. Also, the module cover 11 and formable pillow can be assembled outside a main module facility and the tolerance requirements are minimized due to the formability properties of the film 19 and material 21. The device can use present module covers with minor reforming and any expansion mismatch between the device 17 and the cover 11 are compensated for by the resiliency of the formable pillow comprised of the film 19 and the material 21.

In a particular application it may be desired to provide a positive adhesion between the film 19 and the top of the device 17, such as for example, by using an adhesive material. In other cases, it may be best not to have any adhesive material between the film 19 and the device 17 to facilitate any rework of the module that may be required. However, even if an adhesive is used, it can be seen that the "Z" forces on the top of the device 17 are very minimal because of the deformable characteristic of the heat transfer pillow.

Figure 3:
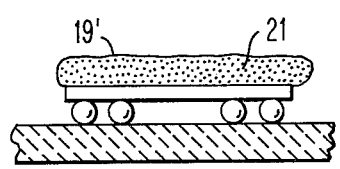

In certain applications it may be desirable that the deformable pillow containing the thermally conductive material 21 be self-contained, rather than using the underside of the cover 11 as a containing boundary. Such an embodiment is illustrated in FIG. 3 where the film 19' completely surrounds the material 21. With this configuration, the pillow can be placed on and/or secured to the backside of the chip prior to being enclosed by the cover (not shown) or alternatively, the pillow could be secured to the cover prior to the enclosure being made.

Figure 4:
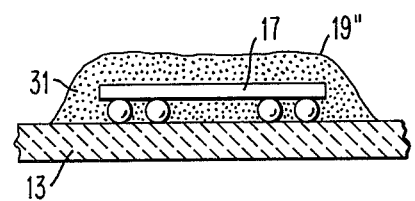

Still another variation of a deformable pillow is shown in FIG. 4. In this embodiment the thermally conductive material 31 is contained between the film 19" and the substrate 13 completely surrounding the chip 17. With this configuration the thermally conductive material 31 must be electrically non-conductive and must not be corrosive or detrimental to the chip and connections, but has the additional advantage of providing an improved heat path between the underside of the chip 17 and the substrate 13.

While the invention has been shown and described in the context of a preferred embodiment, it will be readily apparent to those skilled in the art that other and further modifications may be made therein without departing from the spirit or scope of the invention. It is therefore intended that the invention not be limited to the specific of the foregoing description of the preferred embodiments, but rather as to embrace the full scope of the following claims.

I claim:

1. In an integrated circuit assembly including at least one circuit device mounted on a circuitized substrate with a cover mounted on said substrate to enclose said circuit device, the improvement comprising:

a formable electrically insulative film enclosing a thermally conductive material between said film and the underside of said cover, said film being secured at its periphery to said cover, whereby said film is brought into direct contact with and conforms generally to the top of said circuit device, thereby providing a direct conductive heat transfer path from the circuit device to the cover.

2. The invention according to claim 1 wherein said film is made from the group consisting of polyester and polyimide materials.

3. The invention according to claim 1 wherein said film comprises a thin metallic foil.

4. The invention according to claim 1 wherein said heat transfer material is a thermal grease.

5. The invention according to claim 1 wherein said heat transfer material is a powdered metal.

6. The invention according to claim 1 wherein said heat transfer material is a low melt, metallic substance, which is liquid at room temperature.

7. The invention according to claim 1 wherein said integrated circuit assembly includes a plurality of circuit devices mounted on the circuitized substrate and wherein said film is in direct contact with the tops of each of said circuit devices.

* * * * *